United States Patent [19]

Beasom

[11] 4,456,918

[45] Jun. 26, 1984

[54] ISOLATED GATE JFET STRUCTURE

[75] Inventor: James D. Beasom, Melbourne, Fla.

[73] Assignee: Harris Corporation, Melbourne, Fla.

[21] Appl. No.: 309,194

[22] Filed: Oct. 6, 1981

[51] Int. Cl.³ .................... H01L 29/80; H01L 27/02; H01L 27/04

[52] U.S. Cl. ...................................... 357/22; 357/41; 357/43; 357/89; 357/48

[58] Field of Search ................ 357/22 G, 22 R, 22 P, 357/41, 43, 89

[56] References Cited

U.S. PATENT DOCUMENTS

| | | |
|---|---|---|
| 3,223,904 | 12/1965 | Warner, Jr. et al. ................ 357/22 |
| 3,649,385 | 3/1972 | Kobayashi . |
| 4,143,392 | 3/1979 | Mylroie .................. 357/22 |
| 4,176,368 | 11/1979 | Compton ............................. 357/22 |
| 4,187,514 | 2/1980 | Tomisawa et al. . |
| 4,322,738 | 3/1982 | Bell et al. .............................. 357/22 |

FOREIGN PATENT DOCUMENTS 1145122  3/1969  United Kingdom ................. 357/22

OTHER PUBLICATIONS

"JFET-Transistor Yields Device with Negative Resistance", John A. Porter, IEEE Transactions on Electron Devices, Sep. 1976, pp. 1098–1099.

*Primary Examiner*—Andrew J. James
*Assistant Examiner*—John LaMont
*Attorney, Agent, or Firm*—Barnes & Thornburg

[57] ABSTRACT

A JFET having the top gate isolated from the bottom gate by an annulus source region and thin channel region and a top gate ohmic contact region isolated from the bottom gate by a deep isolation region. The isolation region and the top gate contact region are exterior the active channel region.

20 Claims, 3 Drawing Figures

U.S. Patent  Jun. 26, 1984  4,456,918
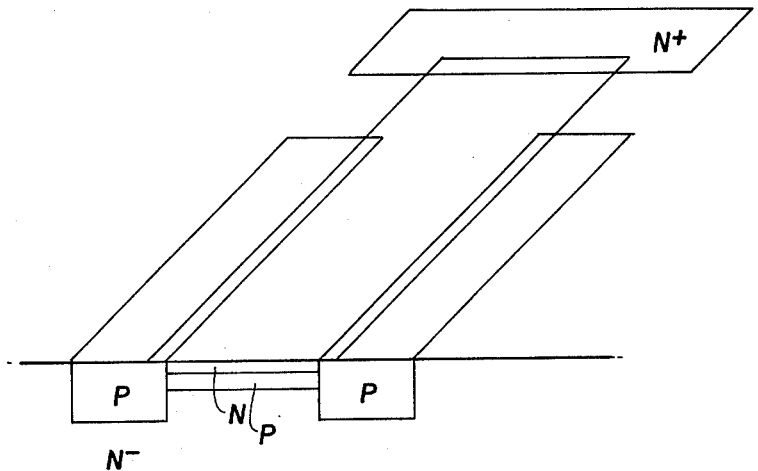
FIG.1
PRIOR ART
FIG.2
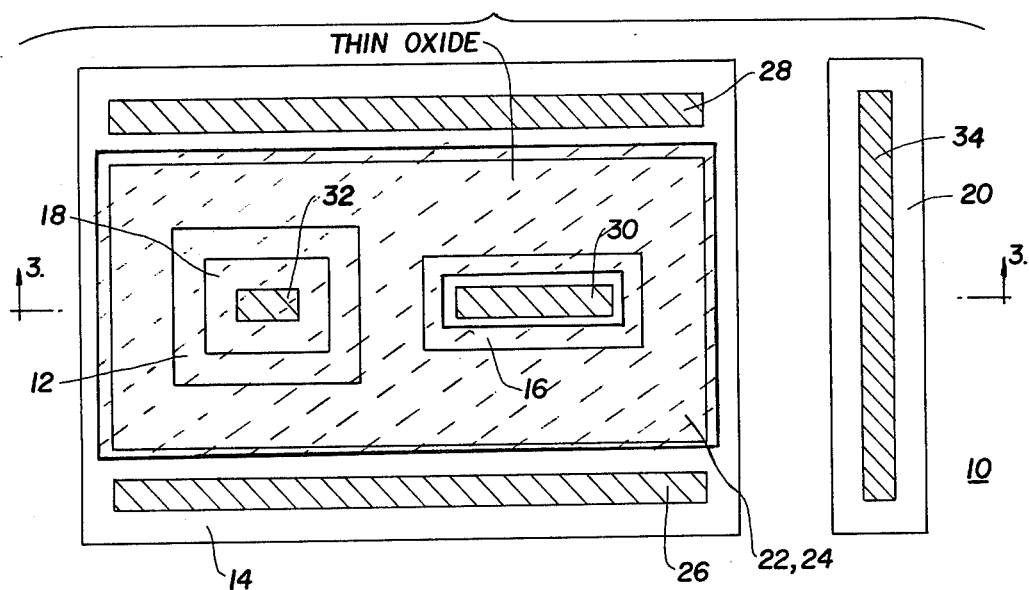
FIG.3
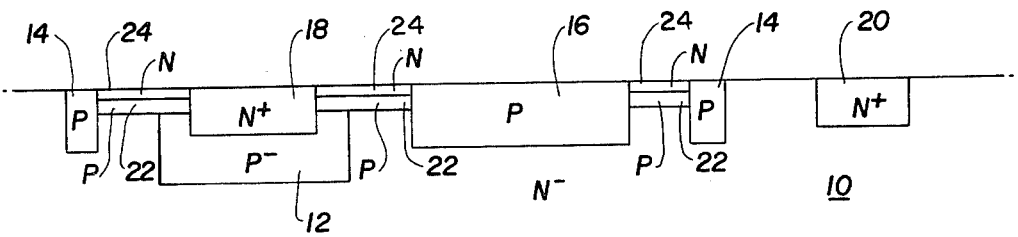

ISOLATED GATE JFET STRUCTURE

BACKGROUND OF THE INVENTION

The present invention relates generally to junction field effect transistors and, more specifically, to an improved thin channel junction field effect transistor.

Junction field effect transistors (JFET) have been used as active devices for many years. More recently, a JFET structure which is compatible with bipolar processing known as a BIFET has been developed. Parallel source and drain regions are formed in a bottom gate region during the base diffusion of the bipolar processing. A common ohmic contact region to the bottom gate region and the to-be-formed top gate region are formed during the emitter diffusion of the bipolar devices The additional BIFET processing steps are ion implantations of a channel region between the source and drain regions and buried below the surface followed by an ion implantation of the top gate region. Since in most applications, the top and bottom gates are connected together, a single ohmic contact to the bottom and the thin top gate regions is used. Also, the top gate extends outside the channel region and makes direct contact with the bottom gate. Such a prior art device is illustrated in FIG. 1.

The P implant which forms a channel region is about 0.3 microns thick and about 0.3 microns below silicon surface. The two P diffusion contacts which form the source and drain along the two edges provide a path from the channel implant up to the top surface wherein interconnects can be made. The N implant forms the top gate and is very shallow typically about 0.3 microns into the top surface. The N top gate implant is lower in impurity concentration than the surface of the P source and drain diffusion and, consequently, aluminum cannot make an ohmic contact thereto. Also, the top gate is so shallow that aluminum will migrate through it to form a short to the channel region if direct contact were made. To avoid these problems, the gate implant is extended and overlaps the N+ contact diffusion at the end of the channel.

In many applications, it is desirable to isolate the top gate from the bottom gate so they can be connected to separate terminals. This is particularly desirable when gate leakage or AC performance is important. In both cases, the presence of isolation region parasitics on the bottom gate make it desirable to disconnect the bottom gate from the input from the signal input or top gate. Another advantage afforded by an isolated gate structure is that several devices can be built in a common bottom gate isolated island rather than in separate isolated islands. This saves die area and improves match of matched pairs by allowing the members of the pair to be closer to one another.

The basic method used in the prior art to isolate top and bottom gates is to form the top gate as a closed geometry surrounding either the source or drain and the top gate surrounded by the other terminal. The choice of a closed geometry provides termination of gate region across the source and drain contact regions along the entire parameter of the gate. This assures that there is no contact between top and bottom gates along their edge. An example of such a closed geometry JFET is illustrated in U.S. Pat. No. 3,649,385.

Thus, there exists the need for a thin channel junction field effect transistor which has an isolated top and bottom gate.

SUMMARY OF THE INVENTION

An object of the present invention is to provide a thin channel junction field effect transistor having isolated top and bottom gates.

Another object of the present invention is to provide a junction field effect transistor compatible with bipolar processing techniques having isolated top and bottom gates.

Still another object of the present invention is to provide a thin channel junction field effect transistor requiring less surface area than prior art devices.

These and other objects of the invention are attained by forming the source as an annulus region with the drain, thin channel and top gate regions formed interior thereto, as well as including, interior to the source an isolation region extending into the bottom gate and a top gate contact region in the isolation region in contact with the thin top gate region which extends over the top of the isolation region. The isolation region isolates the top gate contact region from the bottom gate while the source and channel isolate the top gate region from the bottom gate. The isolation region and the top gate contact region are formed in a portion of the channel and top gate region exterior the region defined on two opposed sides by the lengths of the source and drain regions. The impurity concentration of the isolation region is less than that of the top gate region and the impurity concentration of the top gate contact is greater than that of the top gate region. The depth of the isolation region and the top gate contact region is greater than that of the top gate and thin channel regions. The isolation region may contact and overlap the source region in some applications.

Other objects, advantages and novel features of the present invention will become apparent from the following detailed description of the invention when considered in conjunction with the accompanying drawings.

BRIEF DESCRIPTION OF THE DRAWINGS

FIG. 1 is a perspective cross-sectional view of a BIFET structure of the prior art.

FIG. 2 is a top logical view of a junction field effect transistor in accordance with the principles of the present invention.

FIG. 3 is a cross-sectional view taken along lines 3—3 of FIG. 2.

DETAILED DESCRIPTION OF THE PREFERRED EMBODIMENTS

The improved thin channel junction field effect transistor of the present invention is illustrated in FIGS. 2 and 3 without the top insulative layer and metal contacts. The cross-hatched areas in FIG. 2 illustrate the position of the contact apertures in an oxide layer and are not included in FIG. 3 for sake of clarity. The bottom gate of the JFET is an N− region 10 which may be a dielectrically isolated region or an epitaxial junction isolated region. The impurity concentration of the bottom gate 10 may be in the range of $1 \times 10^{14}$ to $1 \times 10^{17}$. The thin channel JFET of the present invention is compatible with and may be formed using bipolar processing techniques and, thus, is considered a BIFET. An isolation region 12 is formed in the bottom gate 10 by introducing impurities opposite that of the bottom gate 10 in this example P−. This region may be formed simultaneously with forming the collector of an PNP, a low concentration NPN base region, a low concentration I²L base or a special diffusion designed for isolation functions. The surface impurity concentration of the resulting isolation region 12 should be in the range of $5 \times 10^{15}$ to $5 \times 10^{17}$.

Next, the source and drain regions 14 and 16 are formed by introducing impurities opposite that of the bottom gate or in this example P type impurities into the bottom gate region. In order to achieve a isolated top and bottom gate, the source region 14 is formed as an annulus or closed geometry. The drain 16 is formed interior to the source 14. It should also be noted that the isolation region 12 is formed interior to the source region 14. The source and drain regions 14 and 16 may be formed simultaneously with the formation of bases of NPN bipolar transistors and have a surface impurity concentration in the range of $5 \times 10^{17}$ to $5 \times 10^{19}$. The final step which is common with the bipolar processing is the formation of the N+ top gate and bottom gate contacts 18 and 20 formed in the isolation region 12 and the bottom gate 10, respectively. The N+ surface impurity concentration is in the range of $5 \times 10^{19}$ to $5 \times 10^{21}$.

Next, the thin P channel region is formed by ion implanting P type impurities. The impurities are introduced to form a thin channel region below the surface having thickness in the range of 0.1 to 0.5 microns. The thin channel region overlaps portions of the source region 14 and the drain region 16 and all of the isolation region 12 and top gate contact region 18. The P channel region 22 has a peak impurity concentration in the range of $1 \times 10^{16}$ to $1 \times 10^{18}$. Next, N type impurities are ion implanted to form the top gate region 24 on top of the channel region 22 and on the top of the isolation region 12. The top gate is formed to have a depth in the range of 0.05 to 0.4 microns and interconnects the source 14, drain 16 and the top gate contact 18. The top gate region has an impurity concentration in the range of $1 \times 10^{16}$ to $5 \times 10^{18}$. The impurity concentration of the isolation region 12 is selected to be less than that of the top gate region 24 such that during the ion implantation, the ions will change the conductivity type of the isolation region 12 such that the top gate will contact and be connected to the top gate contact 18. Since the ion implantation of the channel region 22 produces a distinct channel region at a specific depth below the surface, it does not affect the impurity concentration at the top of the isolation region 12. The extent of the ion implants is signified by the dotted lined cross-hatched area in FIG. 2.

Contact to the source is at regions 26 and 28, to the drain at region 30, to the top gate at region 32 and to the bottom gate at region 34.

As is evident from FIG. 2, the active channel region between the source contacts 26 and 28 and the drain contact 30 is the area of the channel region defined on opposed sides by the length of the source and drain regions. The isolation region 12 and top contact 18 are formed outside this area and are laterally displaced therefrom. This particular design thus reduces the amount of surface area required for the formation of an isolation top gate contact. Also, by placing the contact outside the active channel region, the thin dimension of the channel and top gate and its unformity is preserved. The depth required for the deep N+ region 18 is compensated for by forming the deep P− isolation region 12. As discussed above, the thickness of the top gate region is in the range of 0.05 to 0.4 and the thickness of the channel region is in the range of 0.1 to 0.5. Typically, the isolation region 12 is formed to a depth of the range of 2 to 15 microns and the top gate contact 18 is formed generally in the range of 1 to 6 microns. Thus, the isolation region 12 and the top gate contact region 18 have a greater depth than the channel region 22 and the top gate region 24.

The closed gemoetry of the source region 14 isolates the top gate layer 24 from the bottom gate 10 laterally while the channel region 22 isolates the top gate region 24 from the bottom gate 10 along its bottom surface. The isolation region 12 isolates the top gate contact 18 from the bottom gate 10.

It should be noted that the annulus shaped source 14 may be the drain and a source would be formed interior thereto. Although the present example has described a P channel junction field effect transistor, it is obvious that the same processing steps may be used introducing opposite impurity concentration to form an N channel junction field effect transitor. Also, in certain applications it may be desirable to have the P− isolation region 12 overlap the source contact 14. This would provide a bias on the isolation region which may be desirable in some applications.

It should also be noted that the present process may be used to form any thin film device which is to be isolated from the substrate area and requiring an ohmic contact. For example, the top gate may represent a thin film diffused resistor with the P source and/or drain regions and the P channel region forming the junction isolation. In these instances, a pair of isolation regions 12 and contact regions 18 would be required. Another structure could be thin film diodes. These are two examples of other types of structures which may be used wherein a ohmic contact to a thin surface layer is required and the top surface layer and contacts are to be isolated from the region in which it is built.

It is evident from the description of the preferred embodiment, that the objects of the invention are obtained. Although the invention is described and illustrated in detail it is clearly understood that the same is by way of illustration and example only and is not to be taken by way of limitation. The spirit and scope of the present invention is defined by way of the claims.

What is claimed is:

1. A thin channel junction field effect transistor comprising:
   a semiconductor body having an upper surface;
   a bottom gate region of said first conductivity type in said body;
   a thin top gate region of said first conductivity type extending from said surface into said body;
   a thin channel region of a second conductivity type opposite said first conductivity type contiguous to and extending between said top and bottom gate regions;
   a source region of said second conductivity type extending down from said surface and laterally encompassing said top gate and channel regions;
   a drain region of said second conductivity type extending from said surface and laterally encompassed by said top gate and channel regions;
   an isolation region of said second conductivity type distinct from said source and drain regions extending from said channel regions into said bottom gate region a top gate contact region of said first conductivity type extending into said isolation region and lateral encompassed at said surface by said top gate region; and said top gate and channel regions are thin relative to said source, drain, isolation and top gate contact regions..

2. The thin channel junction field effect transistor according to claim 1 wherein said source and drain regions are rectangular and include two opposed lateral walls along their length and wherein said isolation and top gate contact regions are exterior the portion of said channel regions defined by the perpendicular projection of said drain length wall on said source length wall.

3. The thin channel junction field effect transistor according to claim 2, wherein said isolation region contacts a portion of said source region exterior said portion of said source region exterior said portion of said channel region.

4. The thin channel junction field effect transistor according to claim 1, wherein said isolation region and said top gate contact region extend from said surface a greater depth than said top gate region and channel region, respectively.

5. The thin channel junction field effect transistor according to claim 8, wherein said top gate contact region extends from said surface a greater depth than said channel region.

6. The thin channel junction field effect transistor according to claim 1 wherein said isolation region has a lower impurity concentration than said source and drain regions.

7. The thin channel junction field effect transistor according to claim 1, wherein said isolation region has a lower impurity concentration than said top gate region.

8. A thin channel junction field effect transistor comprising:
a semiconductor body having an upper surface;
a bottom gate region of a first conductivity type in said body;
a thin top gate of said first conductivity type extending from said surface into said body;
a thin channel region of a second conductivity type opposite said first conductivity type contiguous to and extending down from said top gate region to said bottom gate region;
a source region and a drain region of said second conductivity type spaced in and extending down from said surface and separated by said top gate and channel regions;
an isolation region distinct from said source and drain regions of said second conductivity type extending from said channel region into said bottom gate region a greater depth than said channel region and contacting said channel region;
a top gate contact region of said first conductivity type extending into said isolation region from said surface a greater depth that said channel region and contacting said top gate region; and
said top gate and channel regions are thin relative to said source, drain, isolation and top gate contact regions.

9. A thin channel junction field effect transistor according to claim 8 wherein said source and drain regions are rectangular and include two opposed lateral walls along their length and wherein said isolation and top gate contact regions are exterior the portion of said top gate and channel regions defined by the perpendicular projection of said length wall of said drain region on said length wall of said source.

10. A thin channel junction field effect transistor according to claim 8 wherein said isolation region has a lower impurity concentration than said source and drain regions.

11. A thin channel junction field effect transistor according to claim 8 wherein said top gate contact region has a greater impurity concentration than said top gate region and said top gate region has a greater impurity concentration than said isolation region.

12. A thin channel junction field effect transistor according to claim 8, wherein said top gate region and said channel regions are ion implanted regions.

13. A thin channel junction field effect transistor according to claim 8, wherein said top gate region has a thickness in the range of 0.05 to 0.4 microns and said channel region has a thickness in the range of 0.1 to 0.5 microns.

14. A thin channel junction field effect transistor according to claim 8, wherein said source region laterally encompasses said top gate region to isolate it from said bottom gate region.

15. A thin channel junction field effect transistor according to claim 14, wherein said isolation region contacts said source region.

16. In a semiconductor structure including a semiconductor body having an upper surface, a first semiconductor region of a first conductivity type in said semiconductor body spaced from said upper surface, a thin second region extending from said surface into said body and of said first conductivity type, a third region of a second conductivity type opposite said first conductivity type contiguous to and extending between said first and second regions at a first depth from said upper surface, the improvement comprising:
a fourth region of said second conductivity type extending down from said third region into said first region to a second depth from said surface greater than said first depth from said upper surface;
a fifth region of said first conductivity type encompassed laterally at said surface by said second region and extending from said upper surface into said fourth region to form an ohmic surface contact region for said second region, wherein said fifth region is isolated from said first region by said fourth region; and
sixth and seventh regions of said second conductivity type extending from said upper surface and into said first region, spaced from each other, distinct from said fourth region and in contact with said third region to provide two spaced ohmic contact regions to said third region, said second and third regions are thin relative to said fourth, sixth and seventh regions.

17. The semiconductor structure according to claim 16 wherein said sixth and seventh regions are rectangular and include two opposed lateral walls along their length and wherein said fourth and fifth regions are exterior the surface area defined by the perpendicular projection of said length wall of said sixth onto said length wall of said seventh region.

18. The semiconductor structure according to claim 16, wherein said sixth and seventh regions have a greater depth than said third region from said upper surface.

19. The semiconductor structure according to claim 16, wherein said fourth region has a lower impurity concentration than said second region.

20. The semiconductor structure according to claim 2, wherein said fifth region has a higher impurity concentration than said second region.

* * * * *